United States Patent [19]

Jackson

[11] Patent Number: 4,978,636
[45] Date of Patent: Dec. 18, 1990

[54] METHOD OF MAKING A SEMICONDUCTOR DIODE

[75] Inventor: Kevin B. Jackson, Phoenix, Ariz.

[73] Assignee: Motorola Inc., Schaumburg, Ill.

[21] Appl. No.: 456,913

[22] Filed: Dec. 26, 1989

[51] Int. Cl.$^5$ ............................................. H01L 21/22
[52] U.S. Cl. .................................... 437/150; 437/147; 437/154; 437/158; 437/904; 148/DIG. 106; 148/DIG. 174; 357/73; 357/56
[58] Field of Search ............... 437/150, 158, 154, 147, 437/235, 27; 148/DIG. 106, 174

[56] References Cited

U.S. PATENT DOCUMENTS

| | | | |
|---|---|---|---|
| 3,341,377 | 9/1967 | Wacker | 437/150 |
| 3,576,684 | 4/1971 | Mehta et al. | 148/DIG. 106 |
| 3,586,548 | 6/1971 | Pommerrenig | 148/DIG. 106 |
| 3,798,082 | 3/1974 | Schwartz | 437/150 |
| 3,886,004 | 5/1975 | Bruchez | 148/DIG. 116 |
| 4,006,046 | 2/1977 | Pravin | 437/154 |
| 4,879,254 | 11/1989 | Tsuzuki et al. | 437/150 |

*Primary Examiner*—Brian E. Hearn
*Assistant Examiner*—Chandra Chaudhari
*Attorney, Agent, or Firm*—Robert M. Handy

[57] ABSTRACT

High voltage (200–400 volts) Zener diodes having much improved resistance to degradation under 150° C. HTRB are obtained by a junction passivation comprising a thermal oxide next to the silicon, covered by a TEOS CVD glass, a CVD nitride and a further TEOS CVD glass. Multiple Zener voltages are obtained with otherwise identical, simultaneous wafer processing steps by using epi-wafers having different epi doping and thickness. Back-side for wafer thinning is avoided.

13 Claims, 1 Drawing Sheet

METHOD OF MAKING A SEMICONDUCTOR DIODE

FIELD OF THE INVENTION

This invention concerns semiconductor devices and, more particularly, improved means and methods for providing stable passivated PN junctions, especially Zener junctions.

BACKGROUND OF THE INVENTION

The word "passivation" is commonly used in the semiconductor art to refer to surface treatments and/or surface layers provided above the intersection of a PN junction with a semiconductor surface to promote junction stability. It is also well known in the art to form diodes having passivated junctions, including Zener diodes.

There are many different procedures used for forming PN junctions. For example, it has been customary to form high voltage Zener diodes by diffusing impurities into comparatively lightly doped substrates from liquid or gaseous dopant sources. Long drive-in times are frequently employed to produce deep junction and thermal oxides are employed for junction passivation. While such methods are satisfactory for a wide range of Zener devices, they have significant deficiencies that are exacerbated when there is a need for higher voltage devices, e.g., devices having $V_z \geq$ about 200–400 volts.

Among these deficiencies is the need to use comparatively deep diffusions, often resulting in very long drive-in times at high temperatures (e.g. 60 hours at 1250° C.). This increases manufacturing cost due to low equipment utilization and yield loss due to defect formation.

A further deficiency is the need to thin the comparatively lightly doped substrates after diffusion, passivation and front-side metallization and before backside metallization, in order to reduce the series resistance of the devices. Typically, a 100 mm diameter semiconductor wafer is lapped or polished to reduce its thickness from ~0.5 mm to ~0.2 mm. Thinning and post-thinning processing steps are well known sources of wafer breakage and yield loss during semiconductor device manufacture because of the fragile nature of the thinned wafers.

A still further deficiency observed with prior art devices, is their comparatively poor electrical stability when subjected to high temperature reverse bias (HTRB) at, for example $T \geq 150°$ C. It has been observed that many commercially available Zener devices fail when subjected to 150° C. HTRB, despite the fact that the different devices employ different passivation arrangements which give satisfactory performance under more benign test or operating conditions.

Thus, a need continues to exist for diodes or other passivated PN junctions, including Zener diodes, that are easier and cheaper to manufacture and that exhibit improved stability under HTRB tests, especially for $T \geq 150°$ C.

BRIEF SUMMARY OF THE INVENTION

It is an object of the present invention to provide an improved method and structure for diodes and other passivated PN junctions, including Zener diodes. It is a further object to provide an improved method and structure which facilitates inexpensive manufacture and which produces passivated junctions capable of surviving HTRB at $T = 150°$ C. It is a still further object to provide an improved method and structure which facilitates substantially identical and simultaneous processing of multiple wafers intended for Zener diodes having different predetermined values of $V_z$.

These and other objects and advantages are provided by a process comprising, providing a substrate having a semiconductor surface of a first conductivity type, forming an optional thermal oxide on the surface, depositing a first dopant of a second conductivity type opposite the first type through a window in the thermal oxide, then in either order or together, (i) covering the first dopant and a portion of the thermal oxide surrounding the window with a first deposited silica glass and (ii) driving the first dopant into the semiconductor surface to form a first doped region of the second conductivity type extending to the surface, opening a second window in the deposited silica glass extending to the semiconductor surface within the first region and introducing therethrough a second dopant of the second conductivity type into the semiconductor surface to form a second doped region of higher conductivity than the first doped region, providing a nitride layer over the first deposited silica glass and a second deposited silica glass over the nitride layer, and providing a metallic region in contact with the second doped region. It has been found that wafers processed in the above-described manner consistently pass HTRB at 150° C.

In order to simplify processing it is desirable that the step of providing the substrate comprise providing a highly doped base wafer of the first conductivity type covered by a more lightly doped epi-layer of the first conductivity type extending to the surface for receiving the first and second dopants. By providing wafers having different epi-layer thickness and/or doping, Zener diodes having different predetermined $V_z$ values can be obtained from wafers given the same post-epi processing. This substantially simplifies manufacturing. Further, by providing wafers with a low resistivity substrate covered by a more lightly doped epi-layer, wafer thinning is not needed in order to obtain low series resistance values and wafer breakage is substantially reduced.

The passivated diode produced by the above-described steps comprises a substrate of a first conductivity type and with a lightly doped surface, a first doped region of a second conductivity type opposite the first type in the substrate and extending to the surface and forming a PN junction with the substrate intersecting the surface, and a passivation layer extending above the intersection of the PN junction with the surface, comprising, a thermal oxide against the surface, a first deposited oxide over the thermal oxide, a nitride over the first deposited oxide, and a second deposited oxide over the nitride. It is desirable that a second doped region of the second conductivity type be provided in the first region and extending to the surface for making low resistance contact to the first region. It is further desirable that a metallic region be provided in contact with the second doped region and extending over the passivation layer above the intersection of the PN junction with the surface.

These and other aspects and advantages of the invention will be more fully understood by reference to the figures listed below and the explanation thereof which follows.

In order to facilitate identification of the several different dielectric layer materials used in the prior art and invented structures, the different dielectric layer materials have been consistently cross-hatched in different manners explained herein. Semiconductor and metal regions have been left clear. According to the preferred embodiment, deposited oxides are shown with widely spaced hatching, thermally grown oxides are shown with narrowly spaced hatching, and nitride layers are shown with bold (heavy line) hatching.

DETAILED DESCRIPTION OF THE FIGURES

To simplify expression, the notation "(a)E(b)" is used herein to denote numbers involving powers of ten. For example, $5E15 = 5 \times 10^{15}$, $1E-13 = 1 \times 10^{-13}$, etc. This convention is common in the art.

Figure 1:
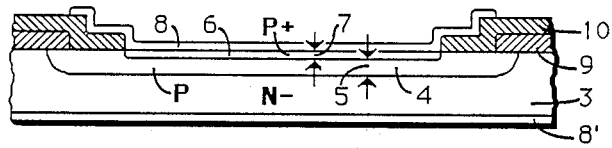
FIG. 1 is a simplified schematic cross-sectional view through a portion of a semiconductor diode, according to the prior art.

FIG. 1 shows a simplified schematic cross-sectional view through a portion of semiconductor diode 2, according to the prior art. Semiconductor diode 2 comprises substrate 3 of, for example $N^-$ silicon, in which has been diffused P region 4 of thickness 5 and $P^+$ region 6 of thickness 7. Substrate 3 typically has a starting thickness of about 0.5 mm and a final thickness after back-lap of about 0.2 mm. Doping depths 5 and 6 are typically about 30–40 micrometers and 0.5–3 micrometers, respectively. Oxide layers 9 and 10 of, typically thermal oxide, protect and passivate the PN junction between substrate 3 and P region 4 where it intersects the device surface. Metallization 8 provides contact to $P^+$ region 6 and metallization 8' provides contact to substrate 3. Ti-Ni-Ag is a typical metallization.

Means and methods for fabricating diode 2 are well known in the art. For example, when a Zener diode having $V_z$ of about 250 volts is desired, wafer 3 is typically doped about $3E15$ atoms/cm$^3$ N-type and P region 4 has a surface concentration of about $3.2E17$ atoms/cm$^3$ and a junction depth of about 35–50 micrometers after typically a 60 hour drive at about 1250° C. $P^+$ region 6 is formed by an aluminum alloy flash and is about 0.5–1 micrometers thick. Growth of thermal oxides 9, 10 and procedures for opening diffusion and contact windows therein are well known. While the diode of FIG. 1 provides satisfactory performance under many circumstances, it has the disadvantages of requiring back-lapping, very long high temperature drive-in times and exhibiting less than perfect performance under 150° C. HTRB tests. Other diodes from several different makers were found to have some or all of these same deficiencies.

The above described problems are avoided by the means and method of the present invention illustrated in FIGS. 2–7. FIGS. 2–7 show simplified schematic cross-sectional views, similar to FIG. 1, through a portion of semiconducotr diode 11, according to a preferred embodiment of the present invention and during different stages of manufacture.

Figure 2:
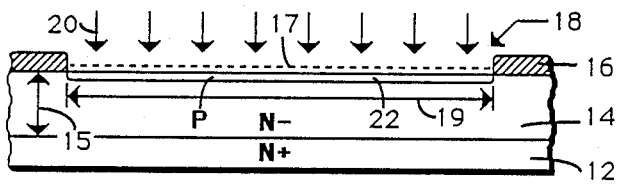
FIGS. 2–7 show simplified schematic cross-sectional views, similar to FIG. 1, through a portion of a semiconductor diode according to a preferred embodiment of the present invention, during different stages of manufacture.

Beginning with FIG. 2, substrate 12 of for example $N^+$ silicon desirably has thereon $N^-$ silicon epi-layer 14 of thickness 15. Passivation layer 16 is provided on the surface of epi-layer 14 and window 18 of lateral dimension 19 opened therein to permit ions 20 to be implanted in region 22 beneath window 18. Screen oxide 17 is desirably provided during implant of ions 20 to reduce surface damage, but this is not essential. Passivation layer 16 is desirably formed by thermal oxidation of substrate 12, 14 using means well known in the art. A four hour steam oxidation at about 1120° C. at atmospheric pressure followed by a dry $O_2$ anneal at the same temperature is suitable but other temperatures, oxidants and pressures may also be used. Layer 16 has a thickness usefully in the range of about 0.8 to 1.6 micrometers, conveniently about 1.0 to 1.4 micrometers, with about 1.2 micrometers being typical.

Where substrate wafer 12 and epi-layer 14 are N-type, ions 20 in region 22 provide a P-type impurity. Ions 20 are conveniently $B^+$ implanted at conveniently about 40 to 120 KeV to a dose of conveniently about $1E14$ to $1E16$/cm$^2$, more preferably at about 60 to 100 KeV to a dose of about $5E14$ to $5E15$/cm$^2$, and at about 80 KeV to a dose of about $5E15$/cm$^2$ being typical, but larger or smaller energies and doses can also be used.

Figure 3:
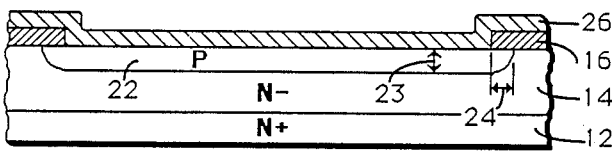

Referring now to FIG. 3, ions 20 implanted in region 22 are annealed and driven into region 14 to provide junction depth 23 and lateral diffusion amount 24. Junction depth 23 is conveniently 10 to 25 micrometers, with about 15 to 22 micrometers being convenient and about 20 micrometers being typical.

Deposited silica glass layer 26 is formed over doped region 22 and remaining thermal oxide 16. Layer 26 is usefully about 0.4 to 1.2 micrometers thick, with about 0.8 to 1.0 micrometers being convenient and about 0.9–1.0 micrometers being typical. Layer 26 may be formed by various well known deposition techniques, but chemical vapor deposition (CVD) from tetra-ethyl-ortho-silicate (TEOS) is preferred. Means and methods for depositing silica glasses by CvD from TEOS and other materials are well known in the art. Deposition at about 0.3 Torr at temperatures in the range of 700–800° C. in a Thermco, Inc., Santa Clara, CA, Model 4900 reactor is suitable but other deposition conditions and reactors may also be used. Deposition rates of about 0.01 micrometers/minute are suitable. Layer 26 may be doped, e.g., with boron, or preferably undoped. Deposition of layer 26 and annealing and drive-in of implanted ions 20 in doped region 22 may be carried out in either order or combined. It is preferred to deposit layer 26 before heating to anneal and drive in doped region 22. This minimizes out-diffusion of the boron from the surface of region 22.

Figure 4:
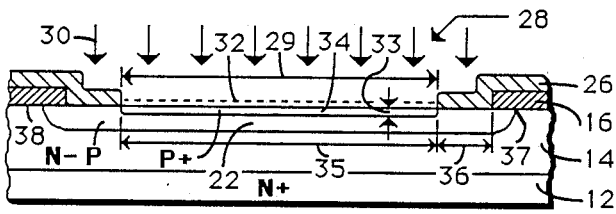

Referring now to FIG. 4, layer 26 is etched using a second mask to provide opening 28 of lateral dimension 29 so that imPurity ions 30 of the same conductivity type as used for region 22 are implanted through (optional) screen oxide 32 to form $P^+$ region 34 of thickness 33 and having lateral dimension 35 which is smaller than dimension 19 by amount 36. This insures that highly doped region 34 is well removed from location 37 where doped region 22 intersects device surface 38.

Figure 5:
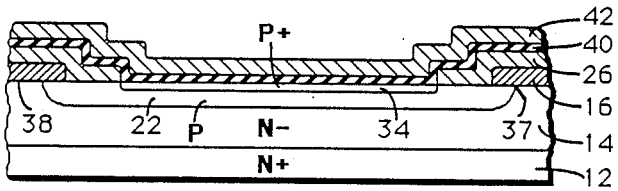

Referring now to FIG. 5, $P^+$ region 34 and the remaining portion of layer 26 are covered by nitride layer 40 and a second deposited silica layer 42. Nitride layer 40 is desirable about 0.8 to 1.2 micrometers thick, more conveniently about 0.9 to 1.1 micrometers thick and typically about 1.0 micrometers thick. Layer 40 is conveniently formed by CVD using means well known in the art, but other deposition methods may also be used.

Deposition of nitride layer 40 is conveniently performed in a Thermco, Inc. Model 4900 reactor at about 700-800° C. and about 0.2 Torr at 80 SCCM of $NH_3$ and 150 SCCM of dichlorosilane, which provides a deposition rate of about 0.0015 micrometers per minute.

Silica layer 42 is desirably about 0.3 to 0.7 micrometers thick, more conveniently about 0.4 to 0.6 micrometers thick with about 0.4 micrometers thickness being typical. Layer 42 is conveniently formed by the same method and under the same conditions as for layer 26, but other methods may also be used. Layer 42 may be doped, e.g., with boron, or preferably undoped.

Annealing of implanted ions 30 in region 34 may be carried out separately or in conjunction with deposition of layers 40 and/or 42, and in either order. It is preferred to anneal separately.

Figure 6:
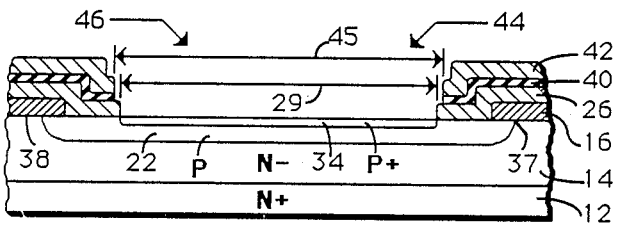

Referring now to FIG. 6, a further masking operation is provided using means well known in the art to etch opening 44 of lateral dimension 45 larger than lateral dimension 29 through layers 42 and 40 to layer 26. It is desirable to use a selective etch which preferentially etches layer 42 while not substantially etching layer 40, then another selective etch to etch layer 40 while not substantially etching layer 26. This insures that opening 46 extending to P+ doped region 34 has the same lateral dimension 29 and is of a shape controlled by mask opening 28. Lateral dimension 45 is made slightly larger than lateral dimension 29 so as to accommodate incidental misalignment during manufacture without reducing distance 36 between contact window 46 and PN junction edge 37. It is advantageous that the mask used to produce opening 46 not be the same mask used to produce opening 28 since using different masks reduces the likelihood of inducing oxide defects during etching.

While the foregoing process places P+ region 34 in P region 22 before applying layers 40, 42, this is not essential. Region 34 may be formed either before applying layers 40, 42, or after opening window 46. Either arrangement provides satisfactory results. The function of region 34 is to enhance the surface doping density of region 22 to facilitate making an ohmic contact thereto.

Figure 7:
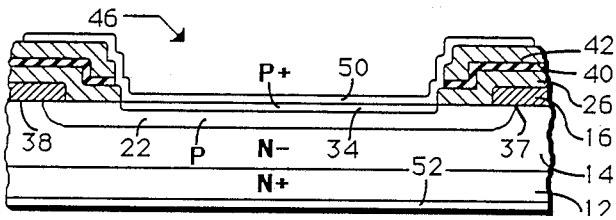

As shown in FIG. 7 metal contact 50 to P+ region 34 is provided in contact opening 46, and metal contact 52 is provided on the back-side of substrate 12. It is desirable that metal contact 50 extend up over passivation layers 16, 6, 40, and 42 above intersection 37 of the PN junction with semiconductor surface 38. Ti-Ni-Ag is preferred for metallization 50, 52.

While the preferred process and structure described above utilize epi-wafers, this is not essential for obtaining improved HTRB results. However, the use of epi-wafers removes or reduces the need to back-lap the wafers prior to back-side metallization. For example, where it was necessary in the prior art to reduce the wafer thickness to about 0.15-0.2 mm in order to have satisfactory electrical properties, with the invented arrangement wafers may be used without back-lap, e.g., 0.53 mm thickness, or where package constraints dictate a thinner wafer, only reduced in thickness to about 0.3-0.4 mm. This substantially improves overall wafer process yield because wafer breakage is much reduced.

Also, by using multiple epi-wafers in which the thickness and/or doping density of the epi-layer are chosen to have predetermined values according to the desired Zener voltage, devices having various pre-selected Zener voltages ($V_z$) may be made with the same post-epi processing steps and equipment, e.g., using the same implant doses, using the same implant dopant drive/anneal times and temperatures, and processed simultaneously. Typically, with prior art devices, it was necessary to vary the doping, deposition and/or drive times and/or temperatures in order to obtain different values of $V_z$ so that various wafers intended for different $V_z$ values could not be processed at the same time and/or under the same conditions and in the same equipment.

The ability to simultaneously process wafers providing predetermined different values of $V_z$ in the same fab line, using the same equipment and with the same implant doses and the same drive/anneal times, is a great manufacturing advantage and contributes to more economical manufacture despite the higher price of the starting epi-wafer as compared to a non-epi-wafer. The yield improvement and performance improvement more than compensate for the higher initial material cost. Further, the substantially reduced drive times, e.g., 12 hours versus 60 hours, contributes to improved equipment utilization and further savings versus the prior art.

It has been found that PN junction diodes constructed according to the above described method and having the above-described passivation structure are particularly resistant to HTRB stress and consistently pass 150° C. HTRB stress tests. This is to be contrasted with prior art devices and with other passivation arrangements, which consistently fail the same test. The results of comparison of the 150° C. HTRB behavior of various devices having different passivation arrangements is shown in Table I below. The differences in processing and passivation among the various devices is indicated in the Table. These were Zener diodes with $V_z$ in the range of 200-400 volts, and were otherwise substantially comparable. Sample No. 1 is the invented method and device. Samples 2-5 are devices made according to various alternative and/or prior art passivation and processing arrangements. Typical test devices had junctions areas of about 0.76×0.76 mm The oxides and nitrides referred to in Table I are substantially stoichiometric oxide and nitrides of silicon prepared by conventional thermal oxidation or chemical vapor deposition (CVD) techniques well known in the art.

TABLE I

| # | PASSIVATION DESCRIPTION | COMPARISON OF 150° C. HTRB TEST RESULTS ON DIFFERENT DIODES | | PROBE YIELD LOSS (%) |
|---|---|---|---|---|
| | | DOPING METHOD & DRIVE TIME | # FAILURES/TOTAL & STRESS TIME | |
| 1. | TH-OX/CVD-OX/ CVD-NI/CVD-OX | ION IMPLANT 12 HOURS | 0/50 1000 HOURS | 2.0 |
| 2. | TH-OX/CVD-OX | ION IMPLANT 12 HOURS | 42/40 1000 HOURS | 5.0 |
| 3. | TH-OX | BCL₃ GLASS 45 HOURS | 7/50 62 HOURS | 6.0 |
| 4. | TH-OX | ION IMPLANT 12 HOURS | 59/100 500 HOURS | 5.0 |
| 5. | TH-OX/CVD-NI/ | ION IMPLANT | 25/50 | 2.0 |

TABLE I-continued
COMPARISON OF 150° C. HTRB TEST RESULTS ON DIFFERENT DIODES

| # | PASSIVATION DESCRIPTION | DOPING METHOD & DRIVE TIME | # FAILURES/TOTAL & STRESS TIME | PROBE YIELD LOSS (%) |
|---|---|---|---|---|
| | CVD-OX | 12 HOURS | 500 HOURS | |

[TH-OX = THERMAL OXIDE; CVD-OX = CVD OXIDE; CVD-NI = CVD NITRIDE]

Experiments numbers 1 and 5 used different masks for the pre-ohmic and the contact windows as illustrated in FIGS. 4 and 6 while runs 2-4 did not. The use of separate masks as illustrated in FIGS. 4 and 6 is believed to account for the higher probe yield observed in runs 1 and 5.

It will be apparent from the data in Table I that the invented arrangement and method provides devices having the same or better yield and at the same time having substantially improved 150° C. HTRB performance. This is a significant advance in the art, since devices having improved 150° C. HTRB are increasingly desired for more demanding applications where exposure to high temperature is increasingly a part of the normal operating environment, e.g., under hood automotive applications. Other device parameters were substantially equivalent.

While the data shown in Table I is for planar devices, it has been observed that the above described process and structure is also applicable to high voltage "mesa" type devices, wherein the junction emerges on an inclined peripheral surface of the die. This exposed junction is covered with the TH-OX/CvD-OX/CvD-NI/CvD-OX sandwich described above. It is desirable to minimize or omit the thermal oxide with the mesa devices because it has been observed that the high temperature treatment necessary to form the thermal oxide can causes reverse blocking voltage degradation. This is true even when steam oxidation is used to form the thermal oxide. However, the native thermal oxide which forms on exposure to air even at room temperature remains. Mesa diodes provided with the above described passivation sandwich consistently survive 150° C. HTRB tests. With the mesa diodes, the passivation layers are formed after junction formation and mesa etch, and before metallization. Ordinarily the metallization laps up onto the edge of the passivation layer at the periphery of the die, but may not extend down the side sufficiently to overlie the intersection of the junction with the mesa sidewall.

Having thus described the invention, it will be apparent to those of skill in the art that the invented method and structure provide improved diodes and other passivated PN junctions, including Zener diodes, and an improved method and structure which facilitates inexpensive manufacture and which produces passivated junctions capable of surviving HTRB at T=150° C., and which an improved method and structure which facilitates substantially identical and simultaneous processing of multiple wafers intended for Zener diodes having different predetermined values of $V_z$.

While the present invention has been described in terms of certain exemplary conductivity types and doping levels and materials, e.g., silicon, those of skill in the art will understand that the indicated conductivity types could be reversed and different doping levels and semiconductor materials used without departing from the present invention. Accordingly, it is intended to include these and other variations as will occur to those of skill based on the teachings herein in the claims that follow.

I claim:

1. A process for forming a passivated semiconductor junction, comprising:
    providing a substrate having a semiconductor surface of a first conductivity type;
    forming a thermal oxide on the surface;
    providing a first doped region of a second conductivity type opposite the first type through a window in the thermal oxide and extending to the surface;
    covering the first doped region exposed in the window and a portion of the thermal oxide surrounding the window with a first deposited silica glass;
    opening a second window in the deposited silica glass extending to the semiconductor surface within the first doped region and introducing therethrough a second dopant of the second conductivity type into the semiconductor surface to form a second doped region of higher conductivity than the first doped region;
    providing a nitride layer over the first deposited silica glass and a second deposited silica glass over the nitride layer; and
    providing a metallic region in contact with the second doped region.

2. The process of claim 1 wherein the step of providing a substrate comprises providing a substrate having a highly doped base of the first conductivity type covered by a more lightly doped region of the first conductivity type extending to the surface, and wherein the driving step comprises driving the first dopant into the more lightly doped region.

3. A process for forming a passivated diode comprising:
    providing a highly doped substrate of a first conductivity type;
    growing an epitaxial layer on the substrate of a predetermined thickness and the first conductivity type and lower doping than the substrate, wherein the epitaxial layer has an outermost surface;
    forming a thermally grown oxide surface;
    forming a first doped region second conductivity type and doping density surface through an opening in the thermal oxide;
    providing a first deposited oxide over the surface and thermal oxide;
    forming a second doped region of the second conductivity type and higher doping concentration within the first doped region through a window in the deposited oxide;
    providing a deposited nitride over the surface and the first deposited oxide;
    providing a second deposited oxide over the nitride; and
    forming an electrical contact to the second doped region through a further window in the deposited nitride and the second deposited oxide.

4. The process of claim 3 wherein the step of forming the electrical contact further comprises forming another electrical contact to an opposite face of the substrate.

5. The process of claim 3 wherein the step of forming the electrical contact further comprises forming the electrical contact through the window in the first deposited oxide.

6. The process of claim 5 wherein the step of forming the electrical contact further comprises forming the contact through the further window wherein the further window has a lateral dimension larger than a corresponding lateral dimension of the window in the first deposited oxide.

7. A process for forming, at the same time, Zener diodes having different predetermined $V_z$ values, comprising:

providing multiple highly doped semiconductor substrates of a first conductivity type and thickness;

on a first substrate, forming a first epitaxial layer of the first type and a first predetermined doping level less than the substrate doping level and of a first thickness;

on a second substrate, forming a second epitaxial layer of the first type and a second predetermined doping less than the substrate doping level and of a second thickness, wherein at least one of the second doping level and thickness is different than the corresponding first doping level and thickness;

doping portions of the first and second epitaxial layers of the first and second substrates with substantially the same predetermined dose of an impurity of a second conductivity type opposite the first type; and simultaneously driving in the dopant in the first and second epitaxial layers at substantially the same temperature and for substantially the same time to form PN junctions in the first and second epitaxial layers having different values of $V_z$.

8. The process of claim 7, further comprising, prior to the doping step, forming thermal oxide layers on the surface of the epitaxial layers and providing windows therein for laterally defining the doped portions.

9. The process of claim 8 further comprising after the doping step, forming first deposited oxide layers extending over the doped portions and the thermal oxide layers.

10. The process of claim 9 wherein the first deposited oxide layers on the first and second epitaxial layers are formed substantially simultaneously.

11. The process of claim 9, further comprising after the step of forming first deposited oxide layers, simultaneously forming nitride layers over each of the first deposited oxide layers.

12. The process of claim 11, further comprising after the step of forming nitride layers, simultaneously forming second deposited oxide layers over each of the nitride layers.

13. The process of claim 12, further comprising, removing a portion of each nitride layer and each second deposited oxide layer above an intended contact to each doped portion while leaving in place remaining parts of the thermal oxide layer, first deposited oxide layer, the nitride layer and the second deposited oxide layer above the intersection of each PN junction with a surface of each epitaxial layer.

* * * * *